United States Patent
Binderbauer et al.

(10) Patent No.: US 9,893,226 B2
(45) Date of Patent: *Feb. 13, 2018

(54) CONVERSION OF HIGH-ENERGY PHOTONS INTO ELECTRICITY

(71) Applicant: TRI ALPHA ENERGY, INC., Foothill Ranch, CA (US)

(72) Inventors: Michl W. Binderbauer, Ladera Ranch, CA (US); Toshiki Tajima, Irvine, CA (US)

(73) Assignee: TAE TECHNOLOGIES, INC., Foothill Ranch, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 15/392,769

(22) Filed: Dec. 28, 2016

(65) Prior Publication Data

US 2017/0236967 A1    Aug. 17, 2017

Related U.S. Application Data

(63) Continuation of application No. 15/087,283, filed on Mar. 31, 2016, now Pat. No. 9,570,644, which is a
(Continued)

(51) Int. Cl.
*G01J 1/00* (2006.01)
*H01L 31/0725* (2012.01)
(Continued)

(52) U.S. Cl.
CPC ............ *H01L 31/0725* (2013.01); *G01T 1/28* (2013.01); *G21H 1/04* (2013.01); *G21H 1/06* (2013.01); *H01L 31/115* (2013.01)

(58) Field of Classification Search
CPC ............ H01L 31/115; G21H 1/06; G21H 1/04
See application file for complete search history.

(56) References Cited

U.S. PATENT DOCUMENTS

| 2,847,585 A | 8/1958 | Christian |
| 3,284,241 A | 11/1966 | Lasser et al. |

(Continued)

FOREIGN PATENT DOCUMENTS

| GB | 1223729 | 3/1971 |
| JP | 63-12179 | 1/1988 |
| JP | 63-182870 | 7/1988 |

OTHER PUBLICATIONS

EP, 11732017.6 Examination Report, dated May 4, 20178.
(Continued)

*Primary Examiner* — Kiho Kim
(74) *Attorney, Agent, or Firm* — One LLP

(57) ABSTRACT

Systems and methods for the conversion of energy of high-energy photons into electricity which utilize a series of materials with differing atomic charges to take advantage of the emission of a large multiplicity of electrons by a single high-energy photon via a cascade of Auger electron emissions. In one embodiment, a high-energy photon converter preferably includes a linearly layered nanometric-scaled wafer made up of layers of a first material sandwiched between layers of a second material having an atomic charge number differing from the atomic charge number of the first material. In other embodiments, the nanometric-scaled layers are configured in a tubular or shell-like configuration and/or include layers of a third insulator material.

18 Claims, 7 Drawing Sheets

Related U.S. Application Data continuation of application No. 13/521,220, filed as application No. PCT/US2011/020001 on Jan. 1, 2011, now Pat. No. 9,324,897.

(60) Provisional application No. 61/293,282, filed on Jan. 8, 2010.

(51) Int. Cl.
*H01L 31/115* (2006.01)
*G01T 1/28* (2006.01)
*G21H 1/04* (2006.01)
*G21H 1/06* (2006.01)

(56) References Cited

U.S. PATENT DOCUMENTS

| | | | |
|---|---|---|---|
| 3,821,556 A | 6/1974 | Hoover | |
| 4,178,524 A | 12/1979 | Ritter | |
| 4,873,555 A | 10/1989 | Coon et al. | |
| 5,111,099 A | 5/1992 | Smith | |
| 5,280,221 A | 1/1994 | Okamoto et al. | |
| 6,333,506 B1 | 12/2001 | Francke et al. | |
| 6,727,503 B1* | 4/2004 | Gerstenmayer | G01T 1/24 250/367 |
| 6,774,300 B2 | 8/2004 | McFarland | |
| 7,028,477 B2 | 4/2006 | Yoshida et al. | |
| 7,186,986 B2 | 3/2007 | Hinderer et al. | |
| 7,399,987 B1 | 7/2008 | Viscor et al. | |
| 7,589,327 B2 | 9/2009 | Kerwin | |
| 2004/0163942 A1 | 8/2004 | Yoshida et al. | |
| 2008/0178924 A1 | 7/2008 | Kempa et al. | |
| 2008/0283764 A1 | 11/2008 | Kerwin | |
| 2009/0065056 A1 | 3/2009 | Upadhayaya et al. | |
| 2009/0110591 A1 | 4/2009 | Guerra | |
| 2013/0125963 A1 | 5/2013 | Binderbauer et al. | |

OTHER PUBLICATIONS

EP, 11732017.6 Extended Search Report, dated Mar. 15, 2016.
TW, 103137578 Office Action, dated Dec. 1, 2015.
TW, 103137578 Search Report, dated Nov. 23, 2015.
SG, 201204985-4 Search Report, dated Sep. 21, 2013.
WO, PCT/US11/20001 ISR, dated Mar. 3, 2011.
WO, PCT/US11/20001 PRP, dated Jul. 10, 2012.

\* cited by examiner

CONVERSION OF HIGH-ENERGY PHOTONS INTO ELECTRICITY

CROSS-REFERENCE TO RELATED APPLICATIONS

This application is a continuation of U.S. patent application Ser. No. 15/087,283, filed Mar. 31, 2016, which is a continuation of U.S. patent application Ser. No. 13/521,220, filed Feb. 4, 2013, now U.S. Pat. No. 9,324,897, which is a national stage entry of PCT Application No. PCT/US2011/020001, filed Jan. 1, 2011, which claims the benefit of U.S. Provisional Application No. 61/293,282, filed Jan. 8, 2010.

FIELD

The embodiments described herein relate generally to photonic energy conversion and, more particularly, to systems and methods that facilitate the conversion of energy from high-energy photons into electricity.

BACKGROUND INFORMATION

There exist many well-known devices that convert the energy of photons in the optical range into electricity, such as, e.g., photovoltaic cells ('solar cells'). These devices are generally made up of at least two materials (i.e. silicon-based semiconductors) with different physical properties, such as different electron affinities (see, P. Würfel, The Physics of Solar Cells, 1st Edition, Wiley-VCH (200)). When one of the materials is illuminated by sunshine, solar photons excite photoelectrons from a valence band into a conduction band, which provides electric mobility. The energy gap between valence and conduction bands is typically on the order of an electron-volt, which is similar to the energy of the incident solar photons. The arrangement of two materials with different electron affinities gives rise to an electric voltage across the material boundary, which may be tapped for electric energy.

There are, however, no known devices for conversion into electricity of energy from photons operating in the high-energy photon regime such as, e.g., XUV, X and gamma rays. Such devices could be used in a wide range of applications—for example, such devices could be used as energy converters for the conversion of high-energy photons emitted by radioactive materials such as, e.g., spent fission fuel rods, emitted from detonation sources such as, e.g., explosives, and emitted from high temperature plasmas and beams of accelerated particles, and as devices in space applications as power sources, shielding, and the like. Difficulties in providing such devices arise from the great penetrability of high-energy photons through matter, which is a consequence of much less interaction of such photons with matter when compared with visible light, and from the fact that for most materials the mean-free-path of electrons is typically many orders of magnitude shorter than the mean-free-path of high-energy photons. As a consequence of this disparity in mean-free-paths, electrons emitted from an atom in a material used to trap the high-energy photons tend to succumb to recombination while their energy converts to heat within the high-energy photon trapping material.

Thus, it is desirable to provide systems and methods that would facilitate the conversion of energy from high-energy photons into electricity.

SUMMARY

The embodiments described herein are directed to the conversion of energy from high-energy photons into electricity. The principle underlying the embodiments provided herein is based on the ejection of electrons from an atom (including the ejection of deep seated inner shell electrons from an atom of high atomic number (high-Z) materials) by high-energy photons. The ejected electrons carry kinetic energy, which can lead to the migration of the ejected electrons into different regions of a device where the accumulation of the ejected electrons can create an electric potential that can then drive an external electric circuit. The photon spectrum of interest includes photons in the non-visible regime including, but not limited to, XUV rays, X-rays, gamma rays and the like.

The systems and methods provided herein utilize a series of materials with differing atomic charges to take advantage of the emission of a large multiplicity of electrons by a single high-energy photon via a cascade of Auger electron emissions. In one embodiment, a high-energy photon converter preferably includes a linearly layered nanometric-scaled wafer made up of a first plurality of layers of a material for absorbing high energy photons and emitting electrons combined with a second plurality of layers of other materials for absorbing or collecting electrons. The material of the second plurality of layers having an atomic charge number differing from the atomic charge number of the material of the first plurality of layers. The first and second plurality of layers are preferably stacked laterally side-by-side (i.e., face-to-face), interposing one another, and oriented at a grazing (shallow) angle to the direction of the propagation of the high energy photons. In another embodiment, the nanometric-scaled layers are configured in a tubular or shell-like configuration. In yet another embodiment, the layers include a third plurality of layers of insulator material.

The systems and methods described herein may be utilized in a wide range of applications—from energy detection and absorption, to energy conversion of high-energy photons in particle accelerators and from other extremely hot matter (such as high temperature plasmas) and/or detonation sources that emit copious high-energy photons (such as explosives), energy capture of emissions of radioactive nuclear wastes (such as spent fission fuel rods), and space applications (such as power sources, shielding, and the like), as well as other applications readily recognizable to one skilled in the art.

Other systems, methods, features and advantages of the example embodiments will be or will become apparent to one with skill in the art upon examination of the following figures and detailed description.

BRIEF DESCRIPTION OF THE FIGURES

The details of the example embodiments, including structure and operation, may be gleaned in part by study of the accompanying figures, in which like reference numerals refer to like parts. The components in the figures are not necessarily to scale, emphasis instead being placed upon illustrating the principles of the invention. Moreover, all illustrations are intended to convey concepts, where relative sizes, shapes and other detailed attributes may be illustrated schematically rather than literally or precisely.

It should be noted that elements of similar structures or functions are generally represented by like reference numerals for illustrative purpose throughout the figures. It should also be noted that the figures are only intended to facilitate the description of the preferred embodiments.

DETAILED DESCRIPTION

Figure 1A:
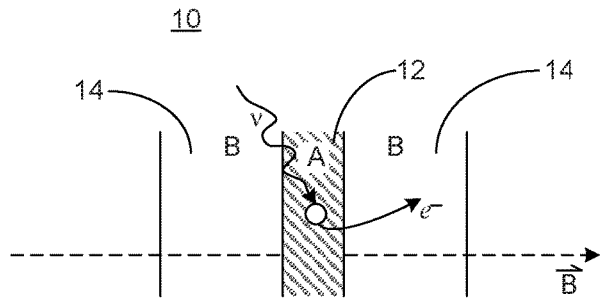
FIG. 1A is a schematic of a linearly layered nanometric-scaled high-energy photon converter element.

Each of the additional features and teachings disclosed below can be utilized separately or in conjunction with other features and teachings to produce systems and methods to facilitate the conversion of energy from high-energy photons into electricity. Representative examples of the present invention, which examples utilize many of these additional features and teachings both separately and in combination, will now be described in further detail with reference to the attached drawings. This detailed description is merely intended to teach a person of skill in the art further details for practicing preferred aspects of the present teachings and is not intended to limit the scope of the invention. Therefore, combinations of features and steps disclosed in the following detail description may not be necessary to practice the invention in the broadest sense, and are instead taught merely to particularly describe representative examples of the present teachings.

Moreover, the various features of the representative examples and the dependent claims may be combined in ways that are not specifically and explicitly enumerated in order to provide additional useful embodiments of the present teachings. In addition, it is expressly noted that all features disclosed in the description and/or the claims are intended to be disclosed separately and independently from each other for the purpose of original disclosure, as well as for the purpose of restricting the claimed subject matter independent of the compositions of the features in the embodiments and/or the claims. It is also expressly noted that all value ranges or indications of groups of entities disclose every possible intermediate value or intermediate entity for the purpose of original disclosure, as well as for the purpose of restricting the claimed subject matter.

The embodiments described herein are directed to the conversion of energy from high-energy photons (such as, e.g., photons with energy preferably in a range of about 100 eV or greater) into electricity. The principle underlying the embodiments is based on the ejection of electrons from an atom (including the ejection of deep seated inner shell electrons from an atom of high atomic number (high-Z) materials) by high-energy photons. The ejected electrons carry kinetic energy, which can lead to the migration of the ejected electrons into different regions of a device where the accumulation of the ejected electrons can create an electric potential that can be tapped to drive an external electric circuit. The photon spectrum of interest includes photons preferably in the non-visible regime including, but not limited to, XUV rays, X-rays, gamma rays and the like. The energy of such photons is orders of magnitude larger and, thus, the margin for thermalization is much greater (the theoretical Carnot coefficient is near unity), than the energy of photons in the visible regime. Because of the high incident photon energy, generally 100 eV or greater, the systems and methods described herein are capable of extraordinarily high efficiency of energy conversion, as compared with other standard energy converters of photons, such as photoelectric devices (e.g. solar cells), or devices based on the thermoelectric effect (e.g., Seebeck effect).

As discussed in further detail below, the systems and methods used to harness this potentially high gain effectively channel the energies of the high-energy photons into an appropriate form of electric energy, which can then be tapped to drive an external circuit, and, thus, cover a wide range of applications, including those where strong magnetic fields are present (such that electron dynamics are characterized by gyromotion across the magnetic fields). As a result, the systems and methods described herein may be utilized in a wide range of applications—from energy detection and absorption, to energy conversion of high-energy photons in particle accelerators, direct energy conversion of high-energy photons from other extremely hot matter (such as high temperature plasmas) and/or detonation sources that emit copious high-energy photons (such as explosives), energy capture of emissions of radioactive nuclear wastes (such as spent fission fuel rods), and space applications (such as power sources, shielding, and the like), as well as other applications readily recognizable to one skilled in the art.

The systems and methods provided herein utilize a series of layers of materials with differing atomic charges to take advantage of the emission of a large multiplicity of electrons by a single high-energy photon via a cascade of Auger electron emissions. In one embodiment, a high-energy photon converter preferably includes a linearly layered nanometric-scaled wafer made up of a first plurality of layers of materials for absorbing high energy photons and emitting electrons combined with a second plurality of layers of other materials for absorbing or collecting electrons emitted from the first plurality of layers. The materials of the second plurality of layers having an atomic charge number differing from the atomic charge numbers of the materials of the first plurality of layers. In another embodiment, the nanometric-scaled layers are configured in a tubular or shell-like configuration. The nanometric layers facilitate the segregation of photoelectrons from donor atoms. Utilizing these structures, the resultant converter may reduce the power flux incident on materials that would otherwise be directly exposed to high-energy photons, thereby reducing the amount of heating of these materials and may also ameliorate the degradation of the materials that are otherwise subject to severe high-energy photon irradiation damages.

Turning in detail to the figures, systems and methods for energy conversion of high-energy photons into electricity with high efficiency are illustrated. For purposes of the foregoing discussion, the converter device or devices are assumed to be embedded in strong magnetic fields that can decisively impact the electron orbits. However, as will be evident below, on the characteristic length scales of the device, the electron orbital properties are minimally affected by the magnetic fields (with strengths that are practically attainable) so that the embodiments are equally applicable to applications where there are little or no magnetic fields present, such as, e.g., spent fission fuel rod applications.

Figure 1B:
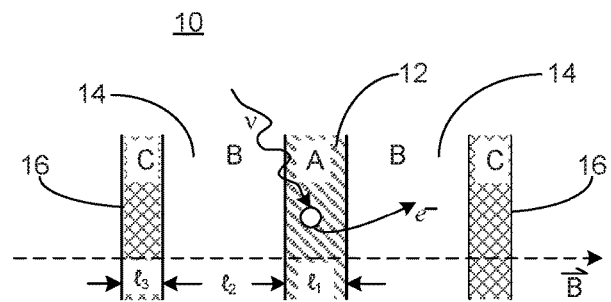
FIG. 1B is a schematic of an alternative linearly layered nanometric-scaled high-energy photon converter element.

Referring to FIGS. 1A through 1F, embodiments of a photon energy converter having a linear structure is shown. As depicted in FIG. 1A, the most basic building block or converter element 10 of a photon energy converter having a linear structure is comprised of a first layer 12 of type A material having a first atomic number $Z_1$ and preferably comprising a high atomic number component, such as, for example, a refractory metal or metal oxide. The first layer 12 is preferably sandwiched between two layers 14 of type B material having a second atomic number $Z_2$ differing from the atomic number of the first layer 12 of type A material, and preferably comprising a metal that is typically preferably characterized by a lower atomic number than the atomic number of the first layer 12 of type A material (i.e., $Z_2<Z_1$). As depicted in FIG. 1B, the basic building block 10 can optionally be enhanced by the addition of an insulator layer 16 of type C material. An exemplary set of types A, B and C materials may include, but is not limited to: A=tungsten (W), B=aluminum (Al), C=insulator such as $SiO2$. Alternatively, the insulator layer might simply be free flowing Helium that can also act as a coolant. However, one skilled in the art will readily recognize that other materials can be substituted consistent with the spirit of the present invention.

Figure 1C:
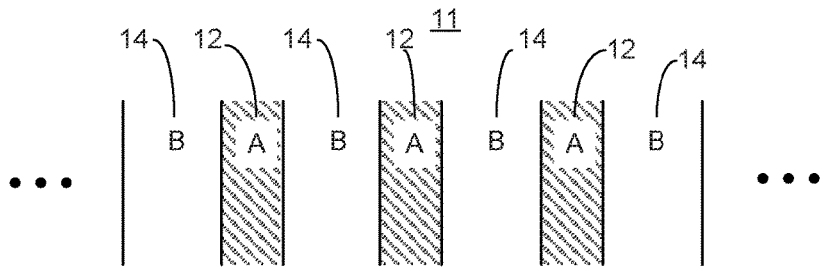
FIG. 1C is a schematic of a high-energy photon converter comprising an array of linearly layered nanometric-scaled converter elements shown in FIG. 1A.
Figure 1D:
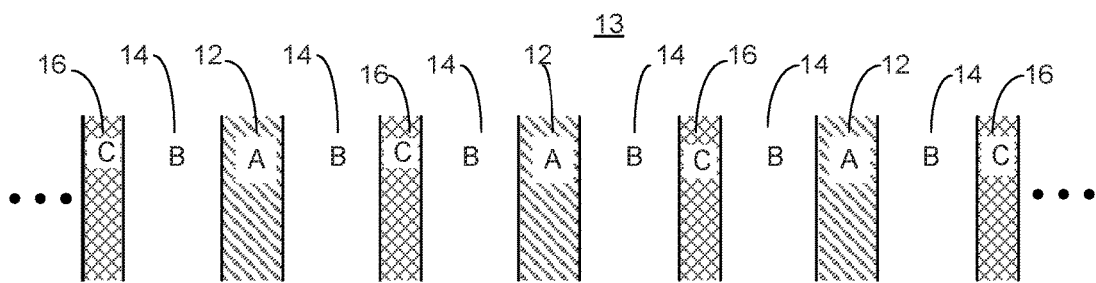
FIG. 1D is a schematic of a high-energy photon converter comprising an array of linearly layered nanometric-scaled converter elements shown in FIG. 1B.

In preferred embodiments depicted in FIGS. 1C and 1D, converters 11 and 13 include a series or an array of the basic building blocks stacked laterally side-by-side (i.e., face-to-face) until the theoretical maximum aggregate photon path-length spent by the photon in all type A layers 12 is comparable to or larger than the mean free path of the high energy photons ν to be absorbed by the type A material. As depicted in FIGS. 1C and 1D, one or more layers 14 of type B material interpose adjacent layers 12 of type A material, and, optionally, a layer 16 of type C insulation material interposes adjacent layers 14 of type B material.

Figure 3:
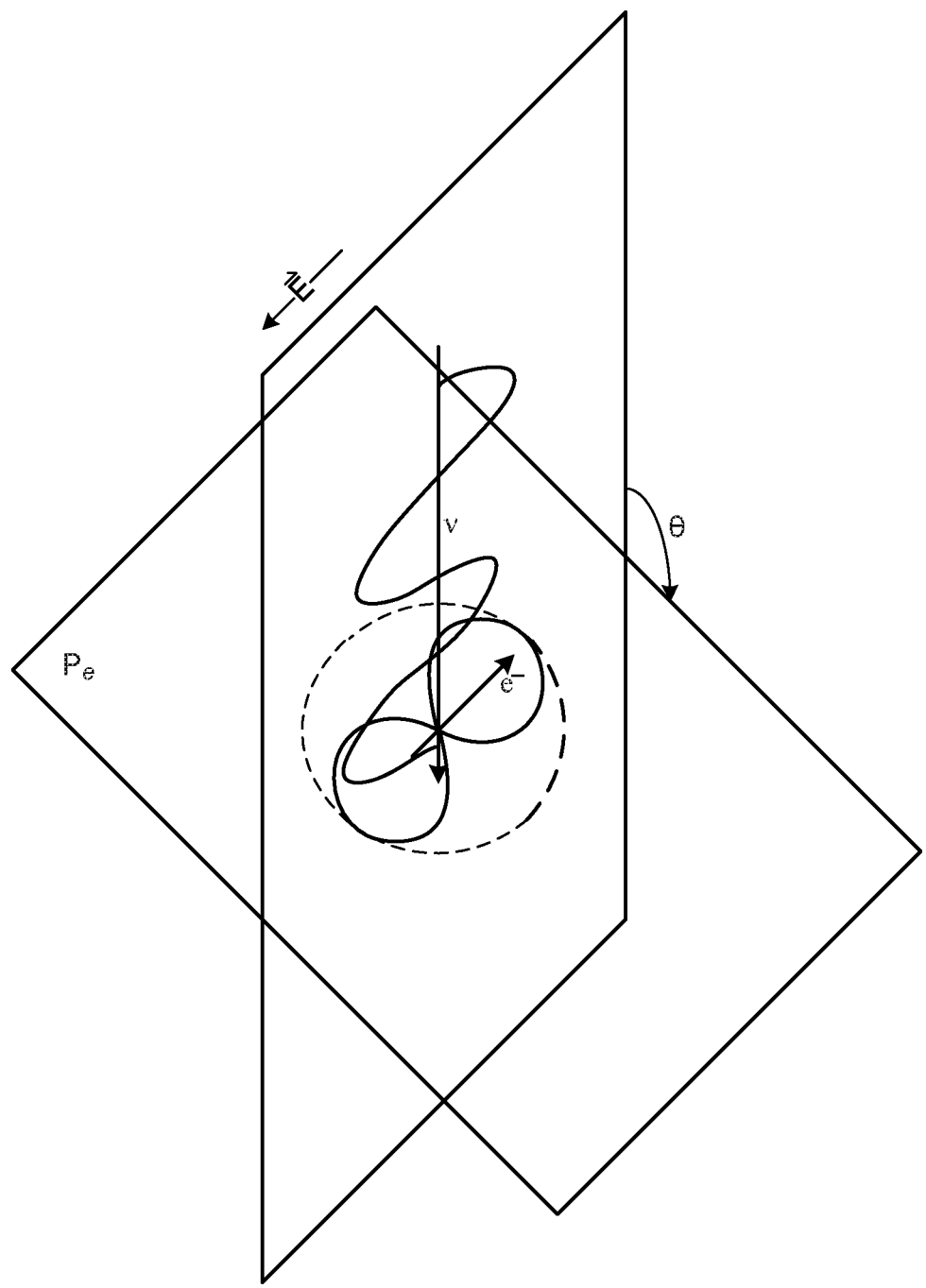
FIG. 3 is a diagram illustrating the propagation characteristics of incident high energy photons v and the migrating characteristics of electrons e⁻ that are ejected from their atoms in a layer of material by the incident high-energy photons v.

Stacking the building blocks or converter elements 10 side-by-side provides a geometry for the overall structure that is well suited to effectively accommodate the electron emissions caused by the high energy photons ν absorbed in the type A material. Because the polarization of photons $\overline{E}$, as depicted in FIG. 3, is perpendicular to the direction of propagation of the photon ν, the direction of the ejected electron $e^-$ is primarily in a plane $P_e$ (with an appropriately decaying angular distribution away from that plane, but peaking on that plane) perpendicular to the direction of the propagation of the photons ν (but such plane contains the polarization of the photons ν). As depicted in FIGS. 1A and 1B, the layers 12 and 14 of the converter elements 10 are stacked side-by-side in a direction such that the normal vector to the boundary surfaces between layers is generally orthogonal to the direction of the propagation of the photons ν. In one preferred configuration described below, the boundary surfaces between layers can be aligned at a grazing (shallow) angle with the direction of propagation of the incident high-energy photon ν. As a result, the electrons $e^-$ that are ejected within the layers 12 of the type A material from their atoms by the incident high-energy photons ν are able to migrate generally orthogonally into the neighboring layers 14 of type B material.

Central to the principle of each embodiment, and any variation thereof, is the requirement that the emitted photo-electrons $e^-$ not be trapped and/or absorbed in the layer 12 of type A material, but rather be absorbed in the layer 14 of type B material. To insure that the ejected electrons $e^-$ are not trapped within the layer 12 of type A material and increase the likelihood that the ejected electrons $e^-$ escape or migrate from the layer 12 of type A material into a layer 14 of type B material, the thickness, fi, of each layer 12 of type A material is preferably smaller than or on the order of the length of the mean free path of electrons in such type A material. The thickness, $l_2$, of each layer 14 of type B material is preferably larger than or on the order of the length of the mean free path of electrons in the type B material. Preferably, the nanometric arrangement of the layers of these embodiments is reflective of the intrinsic physical principles that the electron mean free path in the type A material, $l_e(Z_1)$, is not too different from the electron mean free path in the type B material, $l_e(Z_2)$, while at the same time the photon mean free path in the type A material is much less than its mean free path in the type B material, i.e., $l_p(Z_1) \gg l_p(Z_2)$.

For example for 100 keV incident photons, typical layer thickness dimensions for these systems include $l_1$ for type A material equal to approximately 1 nm and $l_2$ for type B material equal to approximately 100 nm, with $l_3$ for the optional type C material adjusted to prevent arcing between neighboring layers where necessary. For magnetic fields B up to 10 T, these dimensions are less than the gyroradius $\rho_e$ of the electrons. Therefore, on these length scales the electrons are not magnetized, but their dynamics are primarily in the collisional regime. As a result, the converter elements 10 or converters 11 and 13 discussed above are also applicable to applications where magnetic fields are absent or negligibly small.

Figure 1E:
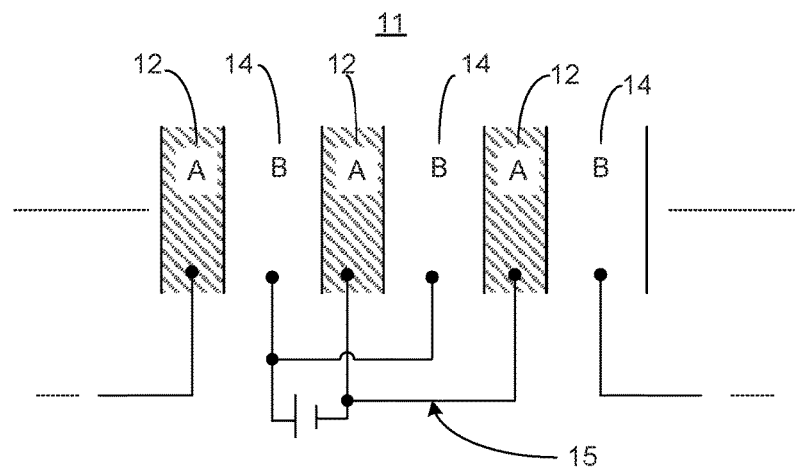
FIG. 1E is a schematic of a high-energy photon converter circuit.
Figure 1F:
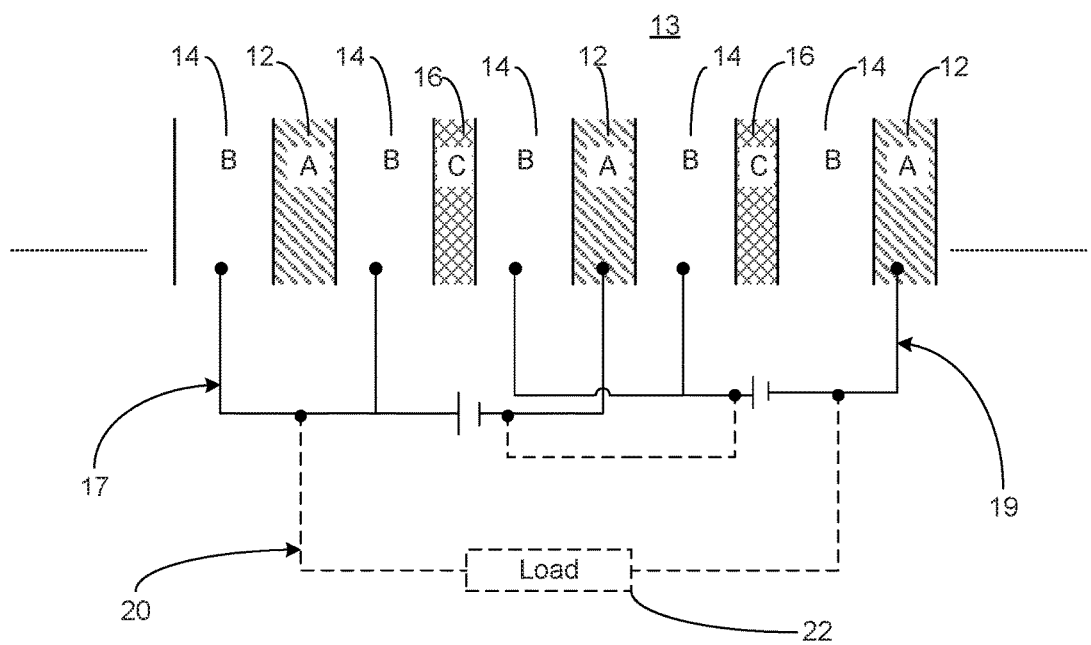
FIG. 1F is a schematic of an alternative high-energy photon converter circuit coupled to an external circuit comprising a load.

The migration into the neighboring layers 14 of type B material of electrons $e^-$ ejected from atoms within the layers 12 of type A material by the incident high-energy photons ν leads to an accumulation of charge and ultimately generates a potential between the layers 12 and 14 of type A and B material. Referring to FIGS. 1E and 1F, all type A and type B layers 12 and 14 are connected to circuits such that each type A layer 12 and type B layer 14 acts as an individual electrode. As readily apparent to one skilled in the art, there exists an almost infinite number of options and alternatives to connect the layers or groupings of layers in parallel or serial fashion. The optimal arrangement of such circuitry is advantageously application determinable as a result. For example, individual layers 12 and 14 can be connected in a fashion whereby each layer 12 of type A material is connected to one of the nearest layers 14 of type B material as depicted in FIG. 1E, or each layer 12 of type A material can be connected to one of the nearest layers 14 of type B material that is separated from it by an insulating layer 16 of type C material as depicted in FIG. 1F. In these configurations, the electrically coupled layers effectively form nano-batteries and the spontaneously formed electric potential difference is on the order of the kinetic energy of migrating electrons. The total voltage available to drive a load is equal to the voltage of an individual nano-battery cell 15 or the sum of the series of nano-battery cells 17 and 19. As depicted in FIG. 1F, an external circuit 20 comprising a load 22 is coupled to the nano-battery cells 17 and 19, which are depicted as coupled in series but could be coupled in parallel. The load 22 may comprise an electrically drivable system or component, an energy storage system, an electrical grid, or the like.

Alternatively, by adjusting the load resistance of the circuit between the electrode layers 12 and 14, the steady state voltage can be externally controlled and the thickness of the insulating layer 16 sized accordingly.

Figure 2A:
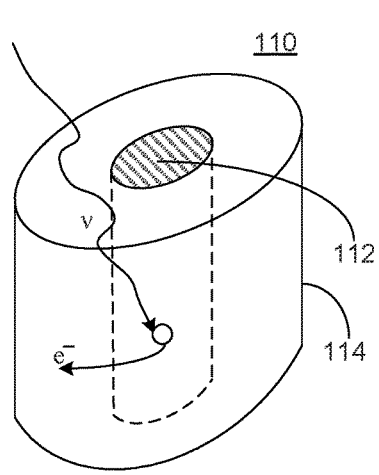
FIG. 2A is a perspective view of a cylindrically layered nanometric-scaled high-energy photon converter element.

In another embodiment, the basic building block includes a cylindrical tube or shell configuration. As illustrated in FIG. 2A, a cylindrical converter element 110 comprises a cylindrical core 112 of type A material surrounded by a cylindrical tube or shell 114 of type B material. As depicted in FIG. 2B, it is again possible to optionally surround each shell 114 of type B material with an insulating shell 116 of type C material. In this cylindrical configuration the same dimensional rules apply to the various thicknesses, i.e., the radius of the cylindrical cores 112 of type A material is less than or on the order of about half of the electron mean free path in type A material, about $l_e(Z_1)/2$, while the thickness of the shell 114 of type B material is on the order of the electron mean free path in material B, about $l_e(Z_2)$.

The advantage of the cylindrical tube or shell arrangement of the converter element 110 is the higher efficiency it affords in capturing the emitted electrons as they are emitted with equal probability over an entire 360° azimuth. As depicted in FIG. 3 and described above, electrons e⁻ are ejected in a direction primarily in a plane $P_e$ (with an appropriately decaying angular distribution away from that plane, but peaking on that plane) perpendicular to the direction of propagation of the photon ν and parallel to the polarization (E) of the photons. Depending on the angle of polarization of the photon, the ejected electron e⁻ can be directed anywhere about the 360° azimuth and in such case the cylindrical arrangement of the cell leads to higher electron capture in type B material and effectively a higher electron capture efficiency as compared to the linear configurations depicted in FIG. 1A through 1F.

Figure 2C:
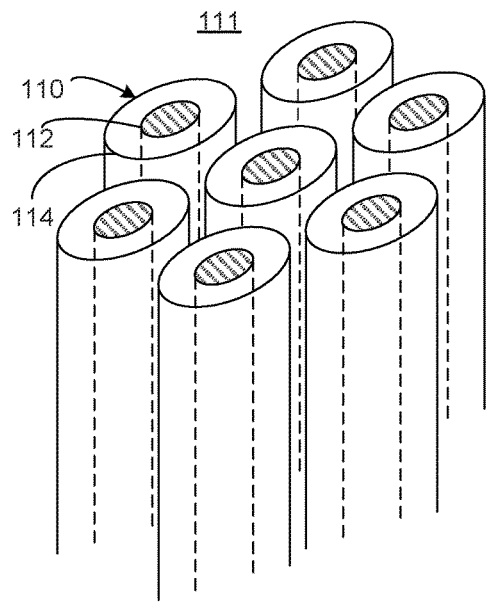
FIG. 2C is a perspective view of a high-energy photon converter comprising an array of cylindrically layered nanometric-scaled converter elements shown in FIG. 2A.
Figure 2B:
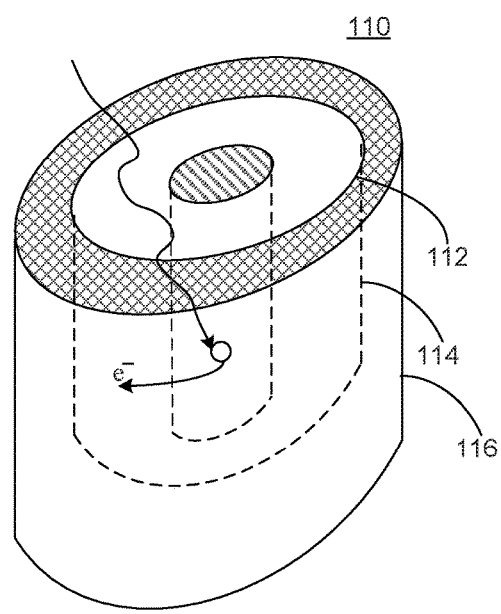
FIG. 2B is a perspective view of an alternative cylindrically layered nanometric-scaled high-energy photon converter element.
Figure 2D:
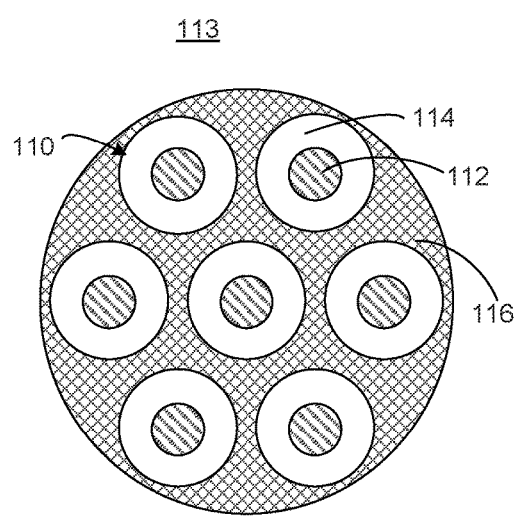
FIG. 2D is an end view of a high-energy photon converter comprising an array of cylindrically layered nanometric-scaled converter elements shown in FIG. 2B.

Similar to the linear geometry converter described above, the cylindrical building blocks 110 are bundled to form aggregate structures that conform to the same physical size constraints as the linear geometry converter. As an example, one particular stacking arrangement 111 is depicted in FIG. 2C. Alternatively, as depicted in FIG. 2D, in another stacking arrangement 113, insulating material 116 can fill the void spaces between adjacent converter elements or cells 110. Such void space can also serve as a conduit for circulating gas coolants, such as pressurized Helium. This forms an effective means of cooling because the photon absorption by He is negligible over the photon energies of interest. Electrical connections are again similar to the linear geometry configurations and likewise afford many different options in connecting the layers or shells 112 and 114 of the building blocks 110.

Figure 2E:
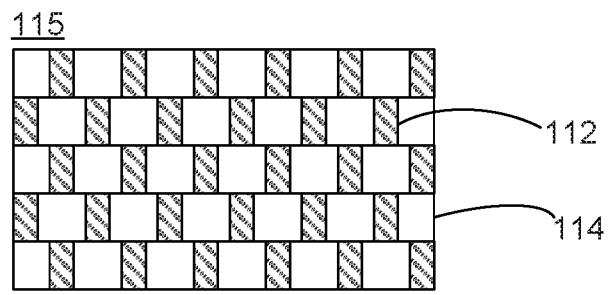
FIGS. 2E, 2F and 2G are end views of high-energy photon converters with alternative geometric configurations.
Figure 2F:
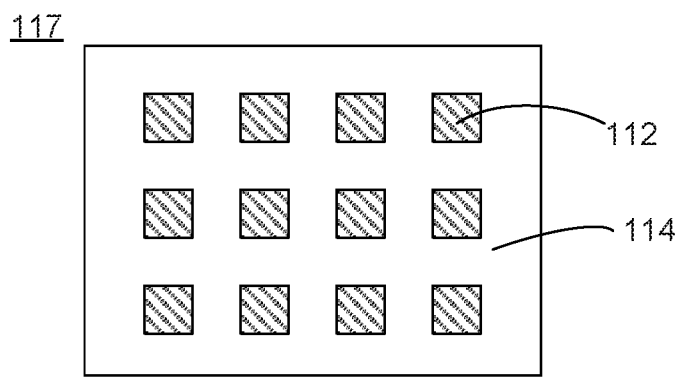
Figure 2G:
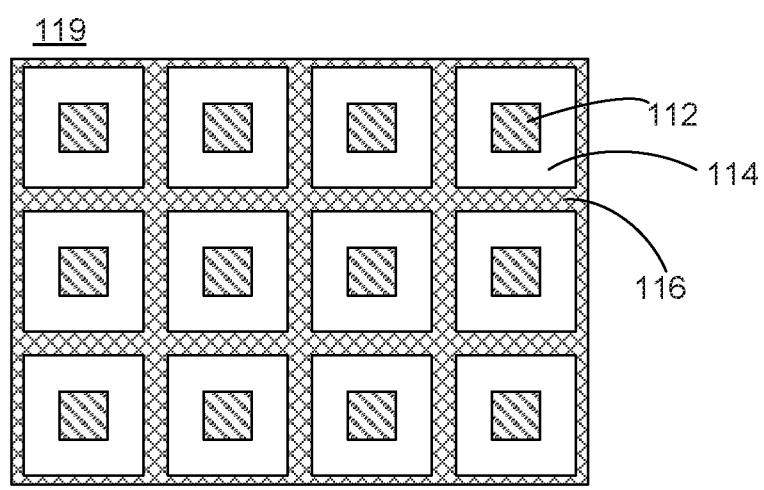

Alternative geometric configurations are shown in FIGS. 2E, 2F and 2G. FIG. 2E shows a staggered linear stacked layered arrangement in which layers 112 of type A material are offset to be positioned adjacent layers 114 of type B material. FIG. 2F shows a plurality of cores 112 of type A material surround by type B material filing the void spaces 114 between the cores 112. Although shown square shaped, the cores 112 could be circular, oval, or the like. FIG. 2G is similar to the configuration in FIG. 2D with the exception of the core 112 and shell layer 114 being square shaped. In these cases the dimensioning of elements 112, 114 and 116 conforms to the same constraints discussed in FIGS. 1A through 1C and FIGS. 2A through 2D. The electron dynamics at the edges of the squares are different, but aside from these edge effects the other physical properties are generally similar to the cylindrical cases.

The basic building block in either geometry, which as described above is made up of up to three kinds of materials, is suitable to spontaneously generate electron separation from the original site of donor atoms, which have been ionized by high-energy photons. This in turn gives rise to the generation of electric voltages between the layers and/or across the optional insulator. As discussed above, such an arrangement can be electrically connected to a circuit to do electric work or transmit power from the converter. As a further variant, it should be noted that one can also apply an external voltage (bias voltage) between these layers, which provides further control over the electric properties and minimizes the potential for arching across any of the layers.

Figure 4A:
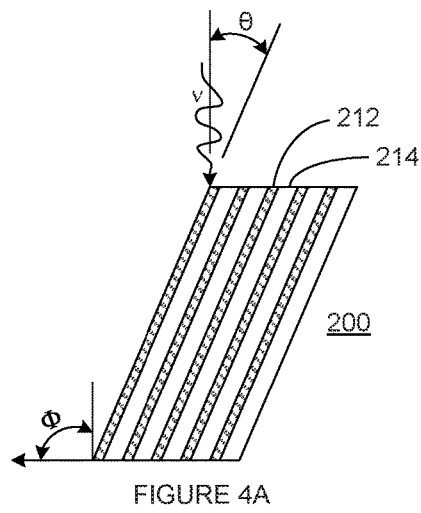
FIG. 4A is a schematic of a converter tile comprising a plurality of linearly stacked layers.
Figure 4B:
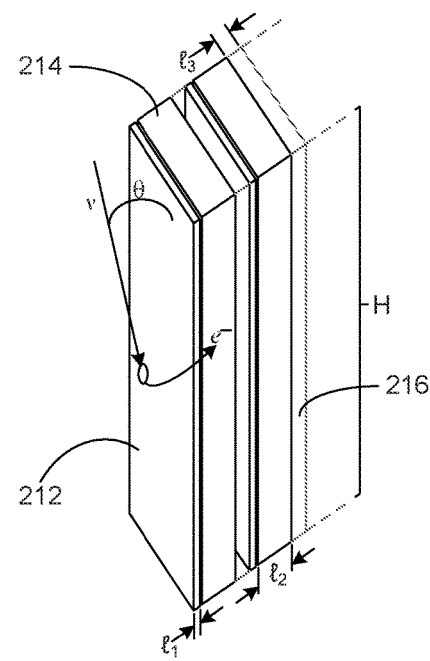
FIG. 4B is a perspective view of a converter tile comprising a plurality of linearly stacked layers.

Referring to FIGS. 4A and 4B, in order to maximize the radiation exposed surface area to insure that the incident high energy photon ν is captured by a layer 212 of type A material and does not simply pass through a layer 214 of type B material, the stacked layers 212 and 214 of type A and B materials, and the optional layer 216 of type C insulation material, of a converter tile or cell 200 are preferably tilted at a grazing (shallow) angle θ to the direction of propagation of the incident high-energy photon ν, which, for example, may be on the order of about ¹⁄₁₀₀ radian. Tilting the converter tile 200 also assures adequate cooling of the bombarded type A material and minimizes the thickness of each individual layer 212 of type A material (relative to the mean free path of electrons) as well as the aggregate effective thickness of all layers 212 of type A material in the entire converter assembly. Tilting the converter tile 200 at a grazing angle also causes the electrons to be ejected predominantly perpendicularly to the surface of the type A material. It also reduces the necessary number of repeated layers per tile 200 by a factor of approximately 1/θ, as the transmission distance in the type A material is enhanced by the same factor over the case where the orientation angle Φ of the surface of tile 200 is organized normal to the propagation direction of the incident high energy photon ν. It also maximizes the escape of electrons into the adjacent layer of type B material.

In an alternative embodiment, the converter tile 200 depicted in FIGS. 4A and 4B comprises a plurality of cylindrical converter elements 110 (shown in FIGS. 2A and 2B) stacked side by side and tilted at a grazing angle θ.

Referring to FIG. 4B, in order to effectively absorb most of the high-energy photons with energy on the order of about 100 keV, the height H of the device needs to extend to orders of length of about one centimeter (1 cm) in the general direction of the predominant photon propagation. This is due to the desire to intercept the entire photon flux with type A material with sufficient aggregate thickness in the photon propagation direction. Since the thickness of each layer of type B material is typically much greater than the thickness of each layer of type A material ($l_1 \ll l_2$), the total height H of the complete stack of building blocks projected onto the direction of the photon flux needs to be much greater than the mean free path of the particular photons in the type A material to insure that high energy photons encounter type A material over an aggregate distance greater than their mean free path in such material. The height of the complete stack of building blocks, therefore, should exceed the mean free path of photons in the type A material by a factor of at least $l_2/l_1$ or, in the case of inclusion of the insulating layer, by a factor of at least $(l_3+l_2)/l_1$.

As mentioned above, the overall arrangement also provides effective cooling of the converter materials as they are heated by photon absorption as well as subsequent electron heating. The cooling is facilitated because the total surface area in the present embodiment, as depicted in FIG. 4A, is enlarged compared to a simple arrangement of layering the stacks at an orientation angle Φ perpendicular to the direction of the incident photon flux by a factor of 1/θ. It is also possible to flow pressurized gas coolant through pipes built into the structure or simply connect the stacks to heat sinks. One skilled in the art would readily recognize that there may be many other ways to enhance the cooling and that particular implementations will be dictated by the specific application.

Figure 5:
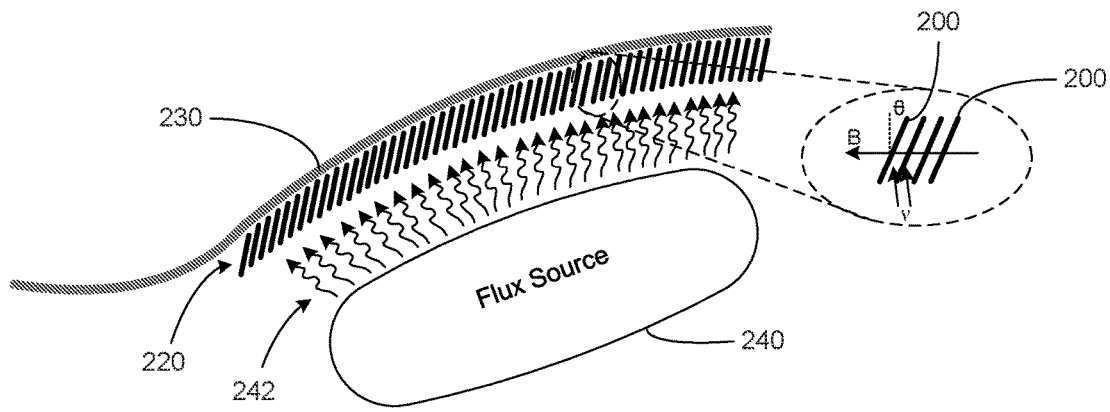
FIG. 5 is a schematic showing an assembly of the tiles depicted in FIGS. 4A and 4B arranged along a conforming surface that intercepts and is substantially perpendicular to a photon flux emitted from a photon flux source

An assembly 220 of the converter tiles 200, as depicted in FIG. 5, can be arranged along a conforming surface 230 that intercepts and is substantially perpendicular to the photon flux 242 emitted from a given photon flux source 240. This configuration provides flexibility and adaptability to a wide spectrum of applications that might require (or benefit from) energy generation from the emitted photon flux.

Figure 6A:
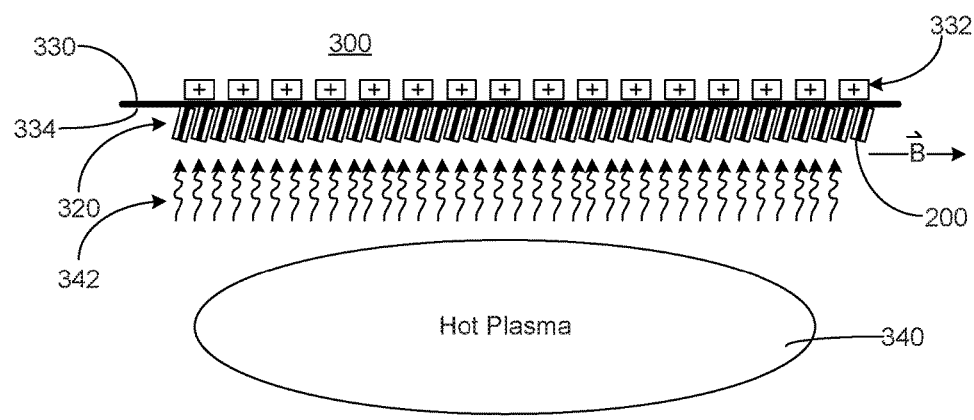
FIGS. 6A, 6B and 6C are schematics showing an assembly of the tiles depicted in FIGS. 4A and 4B arranged along conforming surfaces that intercept and are substantially perpendicular to photon fluxes emitted from photon flux sources.
Figure 6B:
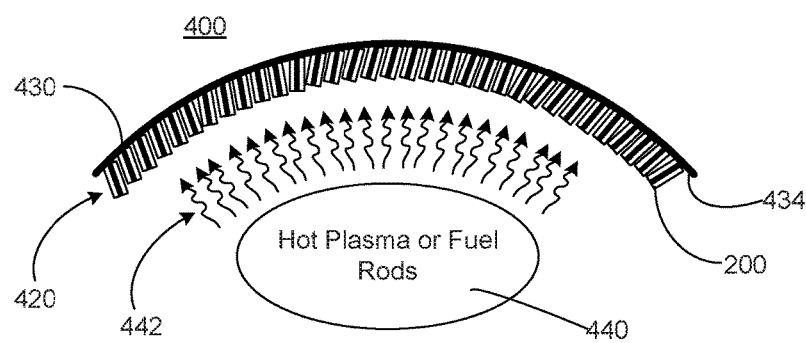
Figure 6C:
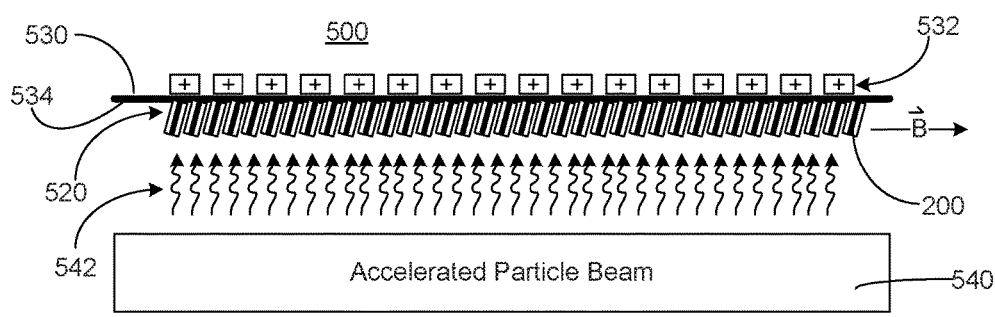

Other examples of overall geometries of typical applications are depicted in FIGS. 6A, 6B and 6C. FIG. 6A shows a plasma containment system 300 that includes a cylindrical chamber 330 having a surface 334 that intercepts and is substantially perpendicular to a photon flux 342 emitted from a source 340 of photon flux shown as hot plasma. The containment system 300 further comprises a magnetic field generator 332 positioned along the cylindrical chamber 330 and an array 332 of converter tiles 200 affixed along the surface 334 of the chamber 330. Each of the tiles is oriented at a grazing angle to the direction of propagation of the incident high-energy photons ν of the photon flux 342. FIG. 6B shows a containment system 400 that includes a cylindrical container 430 having a surface 434 that intercepts and is substantially perpendicular to a photon flux 442 emitted from a source 440 of photon flux shown as hot plasma or expend fission fuel rods. The containment system 400 further comprises an array 432 of converter tiles 200 affixed about the surface 434 of the container 430. Each of the tiles is oriented at a grazing angle to the direction of propagation of the incident high-energy photons ν of the photon flux 442. FIG. 6C shows a particle acceleration system 500 that includes a cylindrical tube 530 having a surface 534 that intercepts and is substantially perpendicular to a photon flux 542 emitted from a source 540 of photon flux shown as an accelerated particle beam. The accelerator system 500 further comprises a magnetic field generator 532 positioned along the cylindrical tube 530 and an array 532 of converter tiles 200 affixed along the surface 534 of the tube 530. Each of the tiles is oriented at a grazing angle to the direction of propagation of the incident high-energy photons ν of the photon flux 542.

In each case the emitted high energy photons encounter type A material over an aggregate distance greater than their mean free path in such material A. This assures their proper absorption by atoms within the type A layers and ultimately amplified conversion of photon current to electron current. Surrounding the flux emitting volume, the type A material densely covers all high energy photon flux exposed surface areas, while at the same time allowing for cooling and electrical connections.

It should be noted that in accordance with the embodiments provided herein, multiple electrons are emitted from a particular atom in the type A material due to absorption of high-energy photons. This is because an electron that is knocked out from a particular deep electronic inner shell state creates a vacancy, which is quickly filled by the Auger process, which in turn triggers secondary and tertiary Auger processes, or a cascade of processes. In addition, secondary photon re-emission can trigger further such processes in neighboring atoms. Accordingly, one photon can in principle trigger the aggregate emission of some 100 electrons (and sometimes more). Therefore, this multiple ionization provides double benefits. First, it serves to multiply the amount of electrons per original incident photon by a factor of 100 to 1,000, which leads to high current amplification. Second, it serves to reduce the electron energies from tens of keV to mere tens of eV. Thus, the voltage generated is manageable relative to break down concerns. This provides enhanced conversion of photon energy to electricity (its charge and current), while it also minimizes heating of the target. In fact the system serves as an efficacious coolant means by removing most of the deposited photon energy (via electric energy) from the material that sits next to the photon source and readily transports the converted energy away to remote sites not in the vicinity of the radiation.

The example embodiments provided herein, however, are merely intended as illustrative examples and not to be limiting in any way. Moreover, one skilled in the art will readily recognize that similar systems can be equally adapted to photons of different energies with appropriate modification of parameters.

In the foregoing specification, the invention has been described with reference to specific embodiments thereof. It will, however, be evident that various modifications and changes may be made thereto without departing from the broader spirit and scope of the invention. For example, the reader is to understand that the specific ordering and combination of process actions shown in the process flow diagrams described herein is merely illustrative, unless otherwise stated, and the invention can be performed using different or additional process actions, or a different combination or ordering of process actions. As another example, each feature of one embodiment can be mixed and matched with other features shown in other embodiments. Features and processes known to those of ordinary skill may similarly be incorporated as desired. Additionally and obviously, features may be added or subtracted as desired. Accordingly, the invention is not to be restricted except in light of the attached claims and their equivalents.

What is claimed is:

1. A detector for detecting high energy photon emissions, comprising
   a plurality of layers of a first material that absorbs high energy photons and emits electrons ejected from an atom in an individual layer of the plurality of layers of the first material by a high energy photon absorbed in the individual layer of the plurality of layers of the first material, each layer of the plurality of layers of the first material having a thickness measured along the direction of the emitted electrons that is less than the length of the mean free path of the emitted electrons in the first material, wherein the thickness of each layer of the plurality of layers of the first material measured along the direction of propagation of a high energy photon is less than the length of a mean free path of the high energy photon in the first material, wherein the wavelengths of the high energy photons are in the non-visible regime, and wherein a plurality of layers of the plurality of layers of a first material encountered by a high energy photon along the direction of propagation of the high energy photon having an aggregate thickness measured along the direction of propagation of a the high energy photon that is greater than the length of a mean free path for the high energy photon in the first material, and a plurality of layers of a second material that collects electrons emitted from the plurality of layers of the first material and electrically coupled to the plurality of layers of the first material, each layer of the plurality of layers of the second material having a thickness greater than the length of the mean free path in the second material of the electrons emitted from the plurality of layers of the first material, wherein one or more layers of the plurality of layers of the second material interposing adjacent layers of the plurality of layers of the first material, wherein the direction of propagation of the high energy photons is substantially orthogonal to a normal vector to a boundary surface between adjacent layers of the plurality of layers of the first and second material, and wherein the electrons emitted from the first material are emitted in a direction perpendicular to the direction of propagation of the high energy photons.

2. The detector of claim 1 further comprising a plurality of layers of a third material, each layer of the plurality of layers of the third material interposing adjacent layers of the one or more layers of the plurality of layers of the second material.

3. The detector of claim 1 wherein adjacent layers of the plurality of layers of the first and second material are stacked face-to-face.

4. The detector of claim 1 wherein each layer of the plurality of layers of the first material is configured as a cylindrical core and each layer of the plurality of layers of the second material is configured as a cylindrical shell concentrically disposed about the cylindrical core of the first material, wherein the radius of the cylindrical core is less than ½ the length of the mean free path of the emitted electrons in the first material.

5. The detector of claim 4 further comprising a plurality of layers of a third insulating material configured as a cylindrical shell concentrically disposed about the cylindrical shell of the second material.

6. The detector of claim 1 wherein the first material comprises a high atomic charge number component.

7. The detector of claim 6 wherein the high atomic charge number component is a refractory metal or metal oxide.

8. The detector of claim 6 wherein the high atomic charge number component is tungsten.

9. The detector of claim 1 wherein the atomic charge number of the second material differs from the atomic charge number of the first material.

10. The detector of claim 1 wherein the atomic charge number of the second material is lower than the atomic charge number of the first material.

11. The detector of claim 1 wherein the second material is a metal.

12. The detector of claim 11 wherein the metal is aluminum.

13. The detector of claim 1 wherein each of layers of the plurality of layers of the first material is sandwiched between two layers of the plurality of layers of the second material.

14. The detector of claim 1 wherein the high energy photons absorbable by the first material have energies in the range of about 100 eV or greater.

15. The detector of claim 1 wherein the high energy photons absorbable by the first layer of material include X, XUV or gamma rays.

16. The detector of claim 1 wherein the plurality of layers of the first and second material are coupled to a circuit having a load.

17. The detector of claim 16 wherein the load is an electrically drivable component.

18. A detector for detecting high energy photon emissions, comprising a plurality of layers of a first material that absorbs high energy photons and emits electrons ejected from an atom in an individual layer of the plurality of layers of the first material by a high energy photon absorbed in the individual layer of the plurality of layers of the first material, each layer of the plurality of layers of the first material having a thickness measured along the direction of the emitted electrons that is less than the length of the mean free path of the emitted electrons in the first material, wherein the thickness of each layer of the plurality of layers of the first material measured along the direction of propagation of a high energy photon is less than the length of a mean free path of the high energy photon in the first material, wherein the wavelengths of the high energy photons are in the non-visible regime, and wherein a plurality of layers of the plurality of layers of a first material encountered by a high energy photon along the direction of propagation of the high energy photon having an aggregate thickness measured along the direction of propagation of a the high energy photon that is greater than the length of a mean free path for the high energy photon in the first material, a plurality of layers of a second material that collects electrons emitted from the plurality of layers of the first material and electrically coupled to the plurality of layers of the first material, each layer of the plurality of layers of the second material having a thickness greater than the length of the mean free path in the second material of the electrons emitted from the plurality of layers of the first material, wherein one or more layers of the plurality of layers of the second material interposing adjacent layers of the plurality of layers of the first material, wherein the direction of propagation of the high energy photons is substantially orthogonal to a normal vector to a boundary surface between adjacent layers of the plurality of layers of the first and second material, and wherein the electrons emitted from the first material are emitted in a direction perpendicular to the direction of propagation of the high energy photons, and a plurality of layers of a third material, each layer of the plurality of layers of the third material interposing adjacent layers of the one or more layers of the plurality of layers of the second material wherein the third material is SiO2.

* * * * *